(12) United States Patent
Polizzi et al.

(10) Patent No.: US 7,376,810 B2
(45) Date of Patent: May 20, 2008

(54) INTEGRATED DEVICE WITH MULTIPLE READING AND/OR WRITING COMMANDS

(75) Inventors: Salvatore Polizzi, Palermo (IT); Maurizio Francesco Perroni, Messina (IT); Salvatore Mazzara, Palermo (IT)

(73) Assignee: STMicroelectronics S.r.l., Agrate Brianza, (MI) (IT)

( * ) Notice: Subject to any disclaimer, the term of this patent is extended or adjusted under 35 U.S.C. 154(b) by 371 days.

(21) Appl. No.: 10/956,664

(22) Filed: Oct. 1, 2004

(65) Prior Publication Data

US 2005/0120159 A1 Jun. 2, 2005

(30) Foreign Application Priority Data

Oct. 3, 2003 (IT) .......................... MI2003A1893

(51) Int. Cl.
*G06F 12/02* (2006.01)
*G06F 13/16* (2006.01)

(52) U.S. Cl. .............................. 711/211; 710/4; 710/74; 711/1; 711/103; 711/220

(58) Field of Classification Search ...................... None
See application file for complete search history.

(56) References Cited

U.S. PATENT DOCUMENTS

| 6,327,632 | B1 * | 12/2001 | Sollars | 710/10 |
| 6,735,661 | B2 * | 5/2004 | Gelke et al. | 710/307 |
| 6,944,093 | B2 * | 9/2005 | Sumitani | 365/235 |

\* cited by examiner

*Primary Examiner*—Gary Portka
(74) *Attorney, Agent, or Firm*—Lisa K. Jorgenson; Stephen Bongini; Fleit Kain Gibbons Gutman Bongini & Bianco P.L.

(57) ABSTRACT

An integrated device is provided that includes a non-volatile memory having an addressing parallelism and a data parallelism, and a communication interface for interfacing the memory with an external bus. The external bus has a transfer parallelism lower than the addressing parallelism and the data parallelism. The communication interface includes control means for executing multiple reading operations and/or multiple writing operations on the memory according to different modalities in response to corresponding command codes received from the external bus. Also provided is a method of operating such an integrated device.

24 Claims, 4 Drawing Sheets

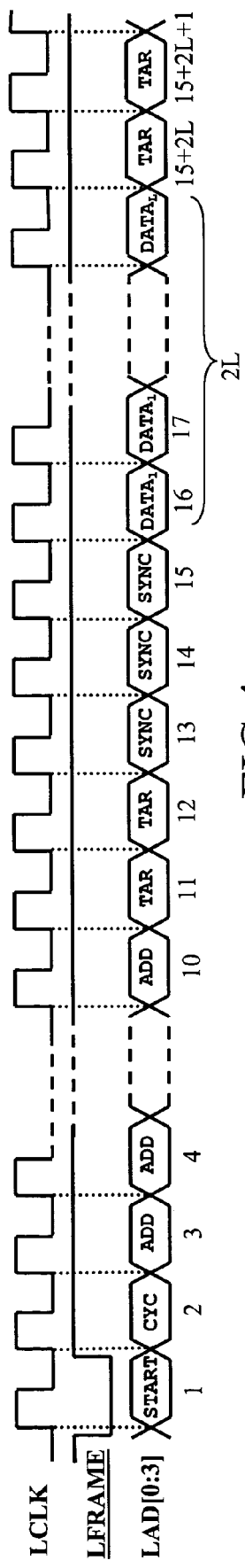
FIG.4
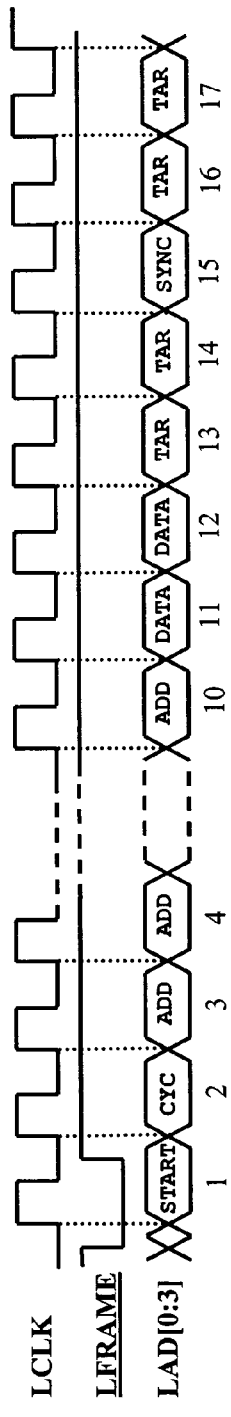
FIG.5
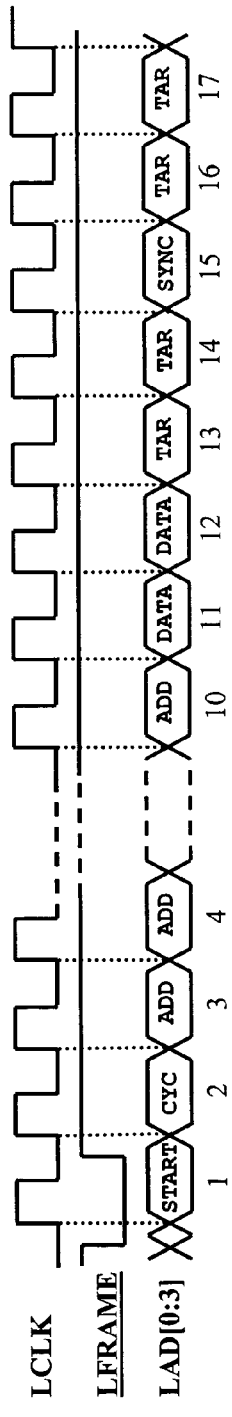

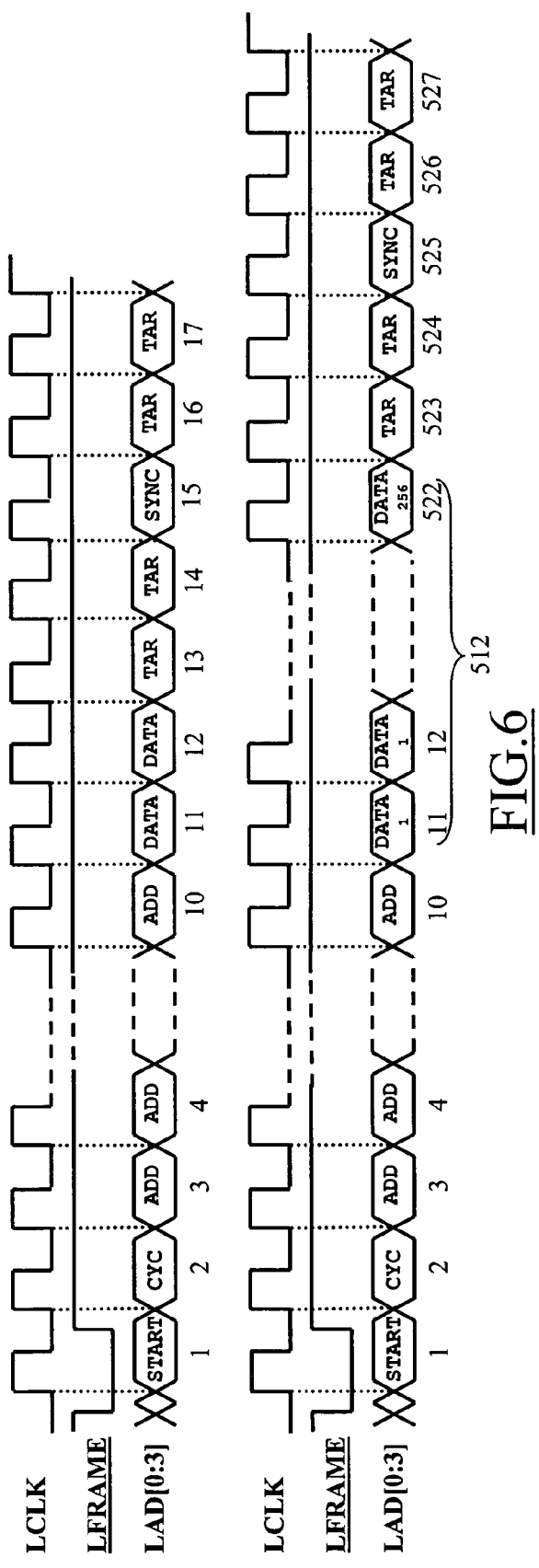
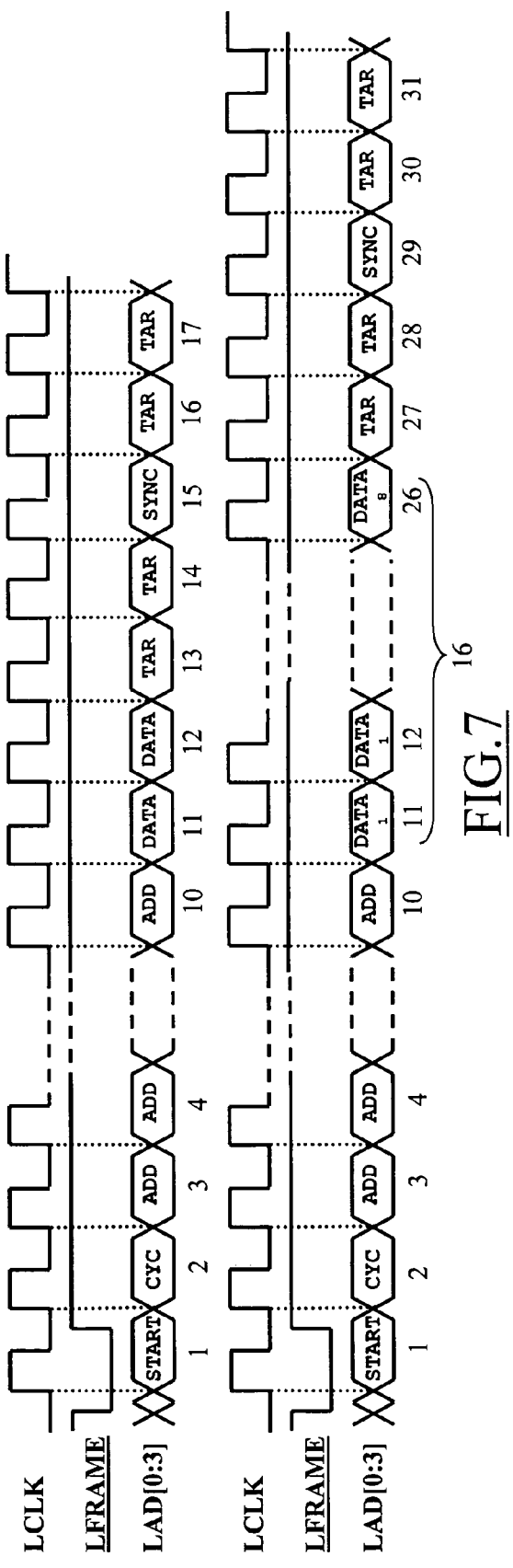
FIG.6
FIG.7

INTEGRATED DEVICE WITH MULTIPLE READING AND/OR WRITING COMMANDS

CROSS-REFERENCE TO RELATED APPLICATIONS

This application is based upon and claims priority from prior Italian Patent Application No. MI2003A001893, filed Oct. 3, 2003, the entire disclosure of which is herein incorporated by reference.

FIELD OF THE INVENTION

The present invention relates to an integrated memory device.

BACKGROUND OF THE INVENTION

In many applications it is important to employ integrated devices that are capable of interacting with other electronic apparatuses (for example, a microprocessor that needs to read the data stored in a non-volatile memory).

Referring in particular to the field of memories, different communication protocols have been proposed with respective bus architectures for the communication. Particular attention has been addressed to protocols that allow operating with a low number of signals so as to limit the corresponding number of pins of the integrated device, and thus the cost and size thereof. An example of such protocols is the Low Pin Count (LPC) protocol that provides a communication bus having a reduced number of signal lines for transferring address codes (for accessing memory locations), data (such as words to be read from the memory or to be written into the same) and command codes (for executing a reading or writing operation on the memory), as well as timing and enabling signals. A bus compliant with the LPC standard exploits a time division multiplexing scheme which permits a transfer parallelism typically lower than the transfer parallelism of the memories, which have a plurality of signal lines for the transfer of both the data and the addresses depending on the sizes of the words and of the memory (in terms of number of locations), respectively.

The known integrated devices that are compliant with the LPC standard comprise a communication interface operatively coupled to the memory. Such an interface allows the external electronic apparatus to execute reading and writing operations within a memory location selected by the corresponding address.

A drawback of such integrated devices is the fact that the communication interface reduces the access and transfer rate (because of the address and data multiplexing). Furthermore, the known communication interfaces are not very flexible; this makes it rather complex to employ the integrated devices in some specific applications.

Further, the known integrated devices do not allow the exploitation at their best of the performance of the respective memories, for example, in applications requiring the repetition of consecutive reading or writing operations.

SUMMARY OF THE INVENTION

In view of these drawbacks, it is an object of the present invention to overcome the above-mentioned drawbacks and to provide an integrated device with multiple reading and writing commands.

One embodiment of the present invention provides an integrated device that includes a non-volatile memory having an addressing parallelism and a data parallelism, and a communication interface for interfacing the memory with an external bus. The external bus has a transfer parallelism lower than the addressing parallelism and the data parallelism. The communication interface includes control means for executing multiple reading operations and/or multiple writing operations on the memory according to different modalities in response to corresponding command codes received from the external bus.

Another embodiment of the present invention provides a corresponding method of operating such an integrated device.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 4 shows the timing of a sequential reading operation;

FIG. 5 shows the timing of a known single writing operation;

FIG. 6 shows the timing of a sequential writing operation; and

FIG. 7 shows the timing of a parallel writing operation.

DETAILED DESCRIPTION OF PREFERRED EMBODIMENTS

Preferred embodiments of the present invention will be described in detail hereinbelow with reference to the attached drawings.

Figure 1:
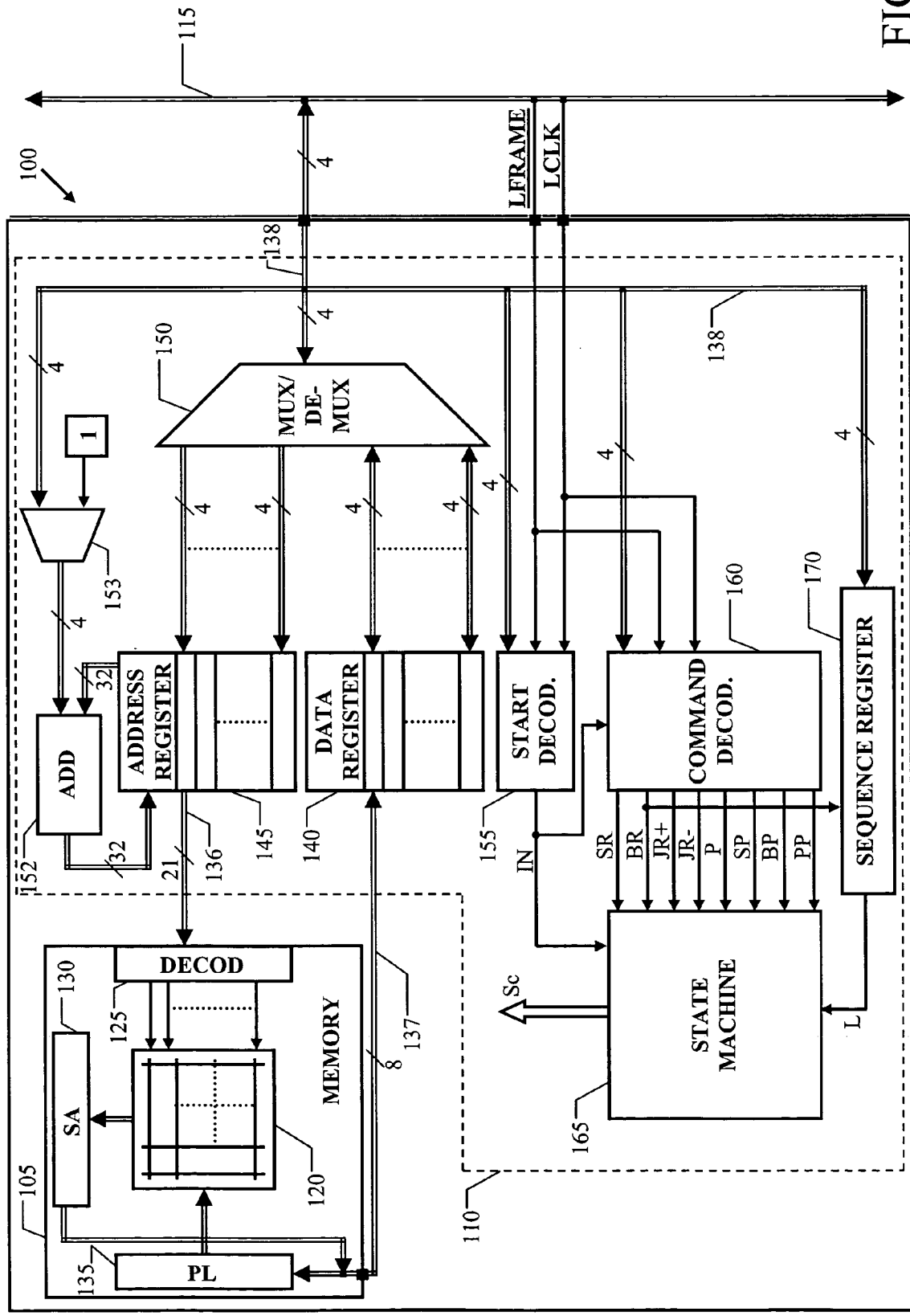
FIG. 1 is a functional block diagram of an integrated device according to an embodiment of the present invention.

FIG. 1 shows a functional block diagram of an integrated device 100 according to an embodiment of the present invention. The integrated device 100 includes (in the same semiconductor chip) a semiconductor memory 105 and a communication interface 110 suitable to interface the memory 105 with external devices (not shown) through a suitable external communication bus 115. For example, such external devices can include a microprocessor, a microcontroller, a digital signal processor (DSP) and the like.

The memory 105 is a memory of the non-volatile type, such as an EEPROM memory of the Flash type. The memory 105 includes a matrix 120 of memory cells (for example, implemented by floating gate MOS transistors) that each store one bit. The memory 105 operates in parallel groups of bits, which define a word stored in a corresponding memory location. The memory locations are selectively accessed, for reading or writing, by providing a corresponding address to the memory 105. The memory 105 is divided into a plurality of sectors, which define the granularity of an erasing operation.

The data parallelism of the memory 105 depends on the number of bits stored in each memory location (i.e., on the length of each word); typically, the memory 105 has a data parallelism equal to one byte (8 bits). The addressing parallelism depends on the size of the memory 105. Let us assume, for example, that the memory 105 has a size of 16 Mbits; in this case the memory 105 must receive an address of 21 bits for selecting a location storing one byte.

The memory 105, in this exemplary embodiment, is divided into 31 memory sectors of 64 kbytes and into further sectors used for storing parameters necessary to the operation of the memory 105 itself.

By means of decoding and selecting circuits 125 the address provided to the memory 105 is decoded in such a way as to univocally select a corresponding location of the memory 105.

The memory 105 includes a bank of sense amplifiers 130 and a bank of program loads 135 that allow executing reading and writing operations on the memory 105, respectively. In particular, the sense amplifiers 130 (the memory 105, for example, contains 64 sense amplifiers) are used for reading the values stored in the memory cells of a "page" (i.e., a subset of locations, in this case 8, selected starting from an initial address). The program loads 135 (there are 64 as well) are operatively coupled to the sense amplifiers 130 and are used for writing data into the memory cells of a selected page. During a writing operation, the 64 program loads 135 are loaded with the values to be written. However, only 8 program loads 135 can be switched on at any time because of power consumption problems. Instead, the sense amplifiers 130 execute a verify operation by reading the values that have been written onto the whole page (after all the 64 program loads 135 have been enabled); in this way, it is possible to reduce the number of operation switchings.

The memory 105 is provided with input/output terminals for receiving/transmitting information from/to the outside (i.e., words read or to be written from/into the memory 105). The input/output terminals of the memory 105 (in this example 8) are connected to a data bus 137 of the communication interface 110 having 8 signal lines.

The address is provided to the memory 105 through an address bus 136 having 21 signal lines. The signal lines of the address bus 136 and of the data bus 137 are typically lines defined by one or more metal layers of the integrated device.

The external bus 115 is a bus with a reduced number of signal lines. In particular, in this exemplary embodiment the external bus 115 is compliant with the LPC standard and includes 4 signal lines LAD[0], LAD[1], LAD[2], and LAD[3] that are used in a time division multiplexed mode for serially transferring information in chunks of 4 bits at a time from/to the memory 105. Furthermore, the external bus 115 includes a signal line LCLK that is used for transferring a clock signal suitable for synchronizing operation of the various devices connected to the external bus 115, and a signal line LFRAME that is used for transferring a start signal of a communication transaction between two devices connected to the external bus 115. The signal LFRAME is underlined to indicate that it is asserted at a low logic value 0 and de-asserted at a high logic value 1. In addition, the communication interface 110 is connected to further signal lines of the external bus 115 provided by the LPC standard, such as power supply and reference lines. Each signal line of the external bus 115 is connected to a respective pin of a package of the integrated device 100.

The communication interface 110 includes a communication bus 138 connected to the signal lines LAD[0], LAD[1], LAD[2], and LAD[3] of the external bus 115, through pads that are each connected to a respective pin of the integrated device 100.

The communication interface 110 includes a register 140 for storing data ("data register") and a register 145 for storing addresses ("address register"). A multiplexing/demultiplexing circuit 150 ("mux/demux") is connected to the communication bus 138, to the address register 145 and to the data register 140 for selectively connecting the two registers 140 and 145 with the communication bus 138.

The address register 145 receives an address from the communication bus 138 in chunks of 4 bits at a time. In this example, the address register 145 receives an address of 32 bits provided by the external bus 115 and thus it has to include at least 32 latches. The 21 least significant bits of the address are used for selecting a location of the memory 105. When the address has been entirely received, the 21 least significant bits are provided in parallel to the decoding and selecting circuits 125 of the memory 105 (i.e., all in only one clock period through the address bus 136).

The data register 140 includes a number of latches sufficient to store a plurality of words, for example, 256. The latches of the data register 140 are enabled to receive/transmit chunks of 8 bits (i.e., a word) at a time, according to the data parallelism of the memory 105, through the data bus 137 and to receive/transmit chunks of 4 bits at time, according to the transfer parallelism of the external bus 115, through the communication bus 138.

The address register 145 is coupled with an adder 152 for varying the current address stored in the address register 145. A first input of the adder 152 receives that address; a second input of the adder 152 is connected to a selector 153 for receiving an offset provided by the external bus 115 or a unitary value. The adder 152, when enabled, outputs a new address to be loaded into the address register 145.

The communication interface 110 further includes a start decoder 155 for notifying the start of a communication transaction between the integrated device 100 and an external device through the bus 115. The start decoder 155 is connected to the communication bus 138 for receiving a start code of 4 bits, to the signal line LFRAME and to the signal line LCLK. The start decoder 155 outputs a signal IN indicative of the beginning of an operation on the memory 105; the signal IN is provided to a command decoder 160 and to a state machine 165.

The command decoder 160 is further connected to the communication bus 138 for receiving command codes (of 4 bits) from an external device for executing a given operation on the memory 105. The command decoder 160 is also connected to the signal line LFRAME and to the signal line LCLK. In response to a given command code the command decoder 160 asserts one of a plurality of signals to the state machine 165.

In the case of known integrated devices, the command code can only indicate that either a reading operation or a writing operation of a single word has to be executed. On the contrary, in embodiments of the present invention (described in greater detail below) the communication interface 110 supports multiple command codes for executing a number of reading and/or writing operations according to different modalities.

The communication interface 110 further includes a sequence register 170 suitable for receiving a reading operation end code from the communication bus 138.

The state machine 165, depending on the signal asserted by the command decoder 160, provides a plurality of control signals Sc for enabling and timing the blocks and the pins of the integrated device 100 in a suitable way during a writing or reading operation.

While the exemplary embodiment is described in relation to a specific memory, the concepts of the present invention also apply when the memory has different data and/or address parallelisms, and when the data register and/or the address register comprises a different number of latches (or equivalent elements). Similarly, the external bus, which has a transfer parallelism lower than the data parallelism and the addressing parallelism of the memory, can be compliant with a communication standard different from the LPC standard. The memory, the memory sectors and the memory locations can have different sizes in terms of storable bits, or each cell can store a different number of bits.

The different operations supported by the integrated device 100 will now be described with reference to FIGS. 2-7, which are each considered in conjunction with FIG. 1.

Figure 2:
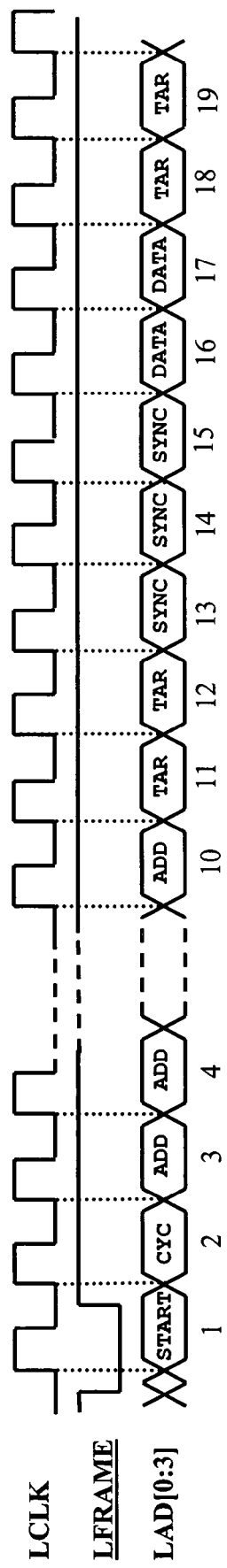
FIG. 2 shows the timing of a known single reading operation.

FIG. 2 shows, in a simplified way, the timing of a reading operation of a single word from the memory 105 ("single reading").

Each operation to be executed on the memory 105 requires at least one communication cycle between the integrated device 100 and an external device, for example, a microprocessor. Each communication cycle is timed by a number of clock periods depending on the operation type and on the size of the information to be transmitted or received (addresses, data or command codes). In turn, each cycle is divided into different steps, corresponding to respective fields, provided by a communication protocol relating to the standard of the external bus 115 and required to execute the operation on the memory 105.

For starting an operation on the integrated device 100 the external microprocessor asserts the signal LFRAME. This event is detected by the start decoder 155 that then waits for receiving the start code of 4 bits (for example, equal to 0001) at a clock period 1 from the lines LAD[0], LAD[1], LAD[2] and LAD[3] of the external bus 115 (field START). In response thereto, the start decoder 155 asserts the signal IN.

The asserted signal IN is provided to the state machine 165, which in response thereto passes to an initial state, and to the command decoder 160, which in response thereto waits for receiving one of a plurality of command codes of 4 bits at the clock period 2 from the lines LAD[0], LAD[1], LAD[2] and LAD[3] of the external bus 115 (field CYC). Each command code is indicative of the type of operation that has to be executed, and thus of the type of communication cycle.

Assuming that the command decoder 160 recognizes a single reading command code (for example, equal to 0100), it asserts a corresponding signal SR that is provided to the state machine 165.

In response to the asserted signal SR the state machine 165 provides the control signals Sc necessary to execute the single reading operation to the blocks and to the pins of the integrated device 100.

In particular, starting from the clock period 3, the state machine 165 enables the mux/demux 150 to connect the communication bus 138 to the address register 145. The address register 145 is enabled to receive and store, 4 bits at a time, a reading address of the memory 105 (field ADD) provided by the lines LAD[0], LAD[1], LAD[2] and LAD[3] of the external bus 115. This means that at the clock period 3, the 4 first latches of the address register 145 are enabled to receive and store the 4 first bits of the reading address, at the clock period 4, 4 other latches of the address register 145 will be enabled to receive and store the 4 next bits and so on until all 32 bits of the reading address are stored. Receiving the reading address of 32 bits thus requires 8 clock periods (from the period 3 to the period 10).

At the clock period 11, the reading address is transmitted in parallel through the address bus 136 to the decoding and selecting circuits 125 of the memory 105, which select the corresponding memory location to be read. At the same time, the external microprocessor provides an inversion code, (for example, equal to 1111), through the lines LAD[0], LAD[1], LAD[2] and LAD[3] of the external bus 115 (field TAR), for indicating an inversion of the communication direction. The inversion code is decoded by the command decoder 160, which accordingly notifies the state machine 165. In response thereto, at the clock period 12 the state machine 165 sets the pins of the integrated device 100 connected to the lines LAD[0], LAD[1], LAD[2] and LAD[3] of the external bus 115 to high impedance (floating state), to allow the communication interface 110 to take the control of the external bus 115 without any interference problems.

Starting from the clock period 13 a synchronization phase (field SYNC) begins. In particular, the state machine 165 transmits a synchronization code (for example, equal to 0101) to the external microprocessor through the lines LAD[0], LAD[1], LAD[2] and LAD[3] of the external bus 115. The synchronization code is transmitted for 2 clock periods, required by the sense amplifiers 130 to read the word stored in the selected location of the memory 105 (actually, the 64 sense amplifiers 130 load the values stored in a whole memory page, i.e., in 8 locations starting from the selected location). At the clock period 15 the state machine 165 transmits an availability code (for example, equal to 0000), indicating that the read word is available starting from the next clock period. Meanwhile, the word loaded in the sense amplifiers 130 of the memory 105 is transmitted to the data register 140 through the data bus 137. The state machine 165 has 8 latches of the data register 140 enabled, which receive in parallel the 8 bits of the word read from the memory 105 (only one clock period).

Starting from the clock period 16 the mux/demux 150 connects the data register 140 to the communication bus 138. The data register 140 is then timed in such a way as to transmit the read word to the lines LAD[0], LAD[1], LAD[2] and LAD[3] of the external bus 115 in chunks of 4 bits at a time (field DATA); for this purpose, 2 clock periods (the periods 16 and 17) are required.

After the transmission of the read word, in order to end the operation on the integrated device 100, 2 further clock periods are required (the period 18 and the period 19) for a further communication inversion (field TAR). In particular, at the clock period 18 the state machine 165 transmits the inversion code 1111 to the external microprocessor through the bus 137 and at the clock period 19 sets the pins of the integrated device 100 to a high impedance condition. The external microprocessor, after having received the inversion code, again takes control of the external bus 115.

In addition to allowing execution of the single reading operation described above (as in known integrated devices), the communication interface 110 also supports more complex reading operations.

Figure 3:
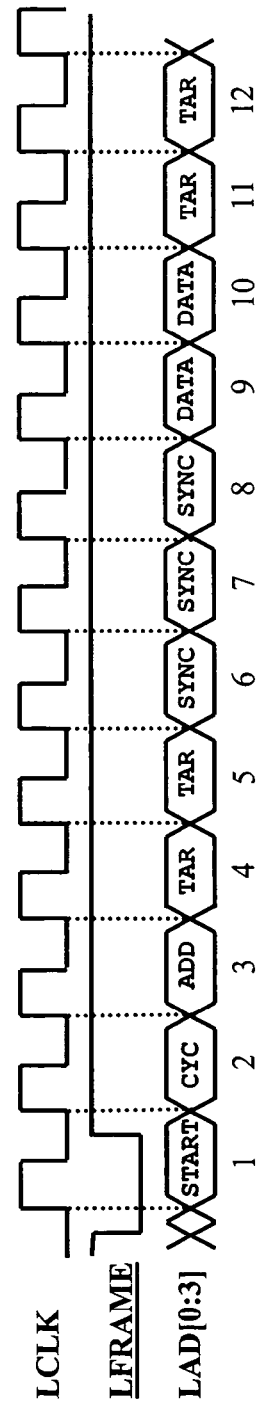
FIG. 3 shows the timing of a jump reading operation executed with the communication interface of an integrated device according to an embodiment of the present invention.

For example, as shown in FIG. 3, the communication interface 110 permits execution of a jump reading operation of a single word from the memory 105 ("jump reading"). The jump reading uses an offset provided by the lines LAD[0], LAD[1], LAD[2] and LAD[3] of the external bus 115 for varying an address stored in the address register 145 during a preceding operation. In particular, a command code for forward jump reading and a command code for back jump reading are indicative of the fact that the reading address has to be increased or decreased by a value equal to the received offset, respectively.

Then, in accordance with the communication protocol, once at the clock period 1 the communication interface 110 has received the start code (field START), at the clock period 2 the command decoder 160 receives the forward or back jump reading command code (field CYC) and asserts a signal JR+ or JR−, respectively, that is provided to the state machine 165.

At the clock period 3 the state machine 165 enables the selector 153 to provide the offset, encoded with 4 bits, provided by the lines LAD[0], LAD[1], LAD[2] and LAD[3] of the external bus 115 (field ADD) to the second terminal of the adder 152. Then the adder 152 adds (signal JR+) or subtracts (signal JR−) the offset to or from the current address that is stored in the address register 145 in a preceding operation, so as to obtain a new reading address. In the case of jump reading only one clock period is required, instead of 8, for obtaining the new reading address in the address register 145.

Analogously to the preceding case, the communication protocol provides, then, 2 clock periods (the periods 4 and 5) for obtaining the inversion of the communication direction (field TAR).

In general 3 clock periods are then required to synchronize the memory 105 (field SYNC, from the period 6 to the period 8 as shown in FIG. 3). However, it should be noted that, if the new reading address corresponds to a location within the same page as the preceding operation, 2 of the 3 clock periods are not necessary for the synchronization. In fact, in a reading operation all 64 sense amplifiers 130 are loaded with the data of a selected page starting from the reading address; then, in such a case the desired word is immediately available in the sense amplifiers 130 and it can be transmitted to the data register 140 in only one clock period.

Analogously to the preceding case, the communication protocol then provides 2 clock periods (the periods 9 and 10) for transmitting the read word onto the external bus 115 (field DATA) and 2 further clock periods (the periods 10 and 11) for the inversion of the communication direction (field TAR).

The communication interface 110 also permits the execution of a reading operation of a sequence of words from the memory 105 ("sequential reading"). The timing of the sequential reading operation is shown in FIG. 4. The sequential reading operation provides the reading of a plurality of words from the memory 105 from locations selected by consecutive addresses starting from an initial reading address.

In such a case the sequence register 170 is used for storing one of a plurality of reading operation end codes necessary to set the length of the sequence of words to be read. Before an operation to be executed on the memory 105, the external microprocessor can provide one of the reading operation end codes in an asynchronous way through the communication bus 138. In particular, it is possible to read the sequence of words up to a last location of the sector including the initial location, up to a last location of the memory 105 or up to the location selected by the address preceding the initial reading address.

In particular, as provided by the communication protocol, once at the clock period 1 the communication interface 110 has received the start code (field START), at the clock period 2 the command decoder 160 receives a sequential reading command code (field CYC), for example, equal to 1010, and asserts a corresponding signal BR that is provided to the state machine 165. The signal BR enables the sequence register 170 as well.

The next 8 clock periods (from the period 3 to the period 10) are used for loading the initial reading address into the register 145 (field ADD); at the same time, the initial reading address is received also by the sequence register 170.

From the clock period 11 to the clock period 15 the communication inversion (field TAR) and the synchronization of the memory 105 (field SYNC) are executed. Meanwhile, the sequence register 170 calculates a corresponding length of the sequence L (i.e., the number of words to be read) that is provided to the state machine 165. In the 2 next clock periods (the periods 16 and 17) the word selected by the initial address (available in the data register 140) is transmitted onto the external bus 115 (field DATA1). At the same time, the initial address is increased by the value 1 by the adder 152 and a new word is made available to a next position of the data register 140; this word can then be transmitted onto the external bus 115. The same operations are repeated until the L words are read; therefore, the reading of the whole sequence requires 2L clock periods.

The communication cycle always ends with the communication direction inversion (field TAR), which needs 2 further clock periods (from the period 15+2L to the period 15+2L+1).

The sequential reading operation permits execution of the reading of a sequence of words in one communication cycle. It is possible to avoid the transfer of corresponding reading addresses, which are instead obtained inside the integrated device 100, and the repetition of the communication direction inversion at every reading of a single word. Furthermore, during the sequential reading operation the synchronization of the memory 105 is necessary only once after the selection of the initial location.

The communication interface 110 further permits the execution of a plurality of writing operations, among which there is the known writing operation of a single word ("single writing") in the memory 105.

As shown in FIG. 5, in general the communication protocol provides that a writing operation is executed in 2 communication cycles between the external microprocessor and the integrated device 100 for a greater degree of safety with respect to possible spurious programmings.

During the first cycle, the communication interface 110 receives from the external microprocessor the start code (field START) at the clock period 1 and a writing command code (field CYC), for example, equal to 0110 at the clock period 2. In response thereto, the command decoder 160 asserts a corresponding signal P that is provided to the state machine 165.

The next 8 clock periods (from the clock period 3 to the clock period 10) are used for loading a writing address into the address register 145 (field ADD), which however is not used.

At the clock periods 11 and 12 the lines LAD[0], LAD[1], LAD[2] and LAD[3] of the external bus 115 provide one of a plurality of secondary writing codes of 8 bits in chunks of 4 bits at a time (field DATA), which code is received from the command decoder 160. Each secondary command code is indicative of the type of operation that has to be executed, and thus of the type of the next communication cycle. Assuming that the command decoder 160 has recognized a command code of single writing (for example, 00010000), it asserts a corresponding signal SP that is provided to the state machine 165.

In the next two clock periods (the periods 13 and 14) the microprocessor transmits the inversion code 1111 (field TAR) and the state machine 165 sets the pins of the integrated device 100 to a high impedance condition (for allowing the communication interface 110 to take control of the external bus 115). The clock period 15 is exploited as synchronization phase (field SYNC), during which the state machine 165 transmits an availability code 0000 (for indicating that the command code has been correctly received). In order to end the first communication cycle, 2 further clock periods are necessary (the periods 16 and 17) to invert the communication direction in such a way that the external microprocessor again takes control of the external bus 115 (field TAR).

In the second communication cycle of the single writing operation, the communication protocol again provides the transmission of the start code at the clock period 1 (field START), the writing command code at the clock period 2 (field CYC) and the writing address from the clock period 3 to the clock period 10 (field ADD).

At the clock periods 11 and 12 the data register 140 receives the word to be written into the memory 105 in chunks of 4 bits at a time through the communication bus 138 (field DATA). Meanwhile, the writing address is provided in parallel through the bus 136 to the decoding and selecting circuits 125.

The protocol provides, then, 2 clock periods (the periods 13 and 14) for inverting the communication direction (field TAR); at the same time, the word to be written is loaded from the data register 140 into 8 program loads 135.

At the clock period 15, the memory 105 can transmit the availability code (field SYNC), indicative of the fact that the word has been received, and it can execute the writing operation in the selected memory location.

The single writing operation ends with a further inversion phase from the clock period 16 to the clock period 17 (field TAR), for allowing the external microprocessor to again take control of the communication bus 115.

Furthermore, the communication interface 110 supports more complex writing operations, unlike the known integrated devices that are capable of executing only the above-described single writing operation.

For example, as shown in FIG. 6, the communication interface 110 permits execution of a writing operation of a sequence of words ("sequential writing") in the memory 105. The sequential writing operation permits writing in the memory 105 of a sequence of a given number of words (for example, 256) starting from an initial writing address.

A secondary sequential writing code (for example, 11101000) is transmitted from the external microprocessor to the communication interface 110 during the first cycle of the operation (analogously to the preceding case); in response thereto, the command decoder 160 asserts a corresponding signal BP.

In the second communication cycle of the sequential writing operation, the communication interface 110 again receives from the microprocessor the start code at the clock period 1 (field START), the writing command code at the clock period 2 (field CYC), and an initial address of the first location to be programmed from the clock period 3 to the clock period 10 (field ADD).

Starting from the clock period 11 the external microprocessor transmits the sequence of words to be written into the memory 105; meanwhile, the initial writing address is provided to the decoding and selecting circuits 125. In particular, the first word to be written is received in a first position of the data register 140 in chunks of 4 bits at a time from the clock period 11 to the clock period 12 (field $DATA_1$), the second word to be written is then received in a next position of the data register 140, and so on up to the clock period 522.

At the same time the state machine 165 controls the data register 140 and the memory 105 in such a way that the memory 105 receives a word of the sequence at a time from the data register 140 through the data bus 137. The first word stored in the data register 140 is loaded into 8 program loads 135 in a clock period and is written into the first location selected by the initial writing address. Then, the value of the initial writing address in the address register 145 is increased by the value 1 by the adder 152 and a further word is loaded into 8 further program loads 135 of the memory 105 in order to be written into the location following the first location, and so on until all the words stored in the data register 140 are written into the memory 105.

The communication protocol provides, then, 2 clock periods (the periods 523 and 524) for inverting the communication direction (field TAR), one clock period (the period 525) for transmitting the availability code (field SYNC) and 2 clock periods (the periods 526 and 527) for allowing the external microprocessor to again take control of the external bus 115 (field TAR).

The sequential writing operation permits writing of a sequence of words in only 2 communication cycles. The repetition of transferring the writing addresses corresponding to the locations to be written is avoided, since the writing addresses are obtained inside the integrated device 100 by the adder 152. Also the inversion of the communication direction and the synchronization of the memory 105 are executed only at the beginning and at the end of the 2 communication cycles of the sequential writing operation.

FIG. 7 shows a parallel writing operation of 8 words in locations of the memory 105 selected starting from an initial writing address ("parallel writing"). The parallel writing operation allows programming a whole page of the memory 105.

The first cycle is similar to that provided by the communication protocol for the sequential writing operation, with the only difference being that the command decoder 160 here receives a parallel writing command code (for example, 00110000) and accordingly asserts a corresponding signal PP.

Analogous considerations have to be applied to the second communication cycle of the operation. In such a case the 8 words to be written are received into the data register 140 from the clock period 11 to the clock period 26. The 8 words are then loaded one at a time into the 64 program loads and written into 8 consecutive locations of the memory 105. In such a case, however, the locations are selected starting from the initial writing address increased internally by the memory 105 itself.

The parallel writing operation is very fast; for example, in the case of a clock signal LCLK with a frequency of 100 MHz it can be completed in a few μs(such as in 10 μs).

The embodiments of the present invention described above are meant to be illustrative, and are not meant to limit the present invention. The concepts of the present invention also apply, for example, when, during a jump reading operation, the received offset is encoded with a different number of bits, or when, during a sequential reading operation, the operation end codes are different. Similarly, during a sequential writing operation the integrated device can receive another number of words or the program loads of the memory can be different in number, to allow the parallel writing of a corresponding number of words in the memory. Further, a writing operation can be executed in only one communication cycle.

More generally, one aspect of the present invention provides an integrated device. The integrated device includes a non-volatile memory (having an addressing parallelism and a data parallelism) and a communication interface for interfacing the memory with an external bus. The external bus has a transfer parallelism lower than the addressing parallelism and the data parallelism. The communication interface includes control means for executing a plurality of reading operations and/or a plurality of writing operations on the memory according to different modalities in response to corresponding command codes received from the external bus.

Accordingly, the present invention permits decoding of a plurality of different command codes, each one corresponding to an operation to be executed on the memory. This makes the integrated device very flexible and ensures higher performance (in terms of execution rate of the operations on the memory).

Such a result is obtained with a negligible increase in the size of the integrated device; it is only partially changed in some blocks for the management of the new commands.

The preferred embodiment of the present invention described above offers further advantages, such as the following.

The single reading operation can be executed on the integrated device according to this preferred embodiment. In this way the integrated device is compliant with the known devices.

Advantageously, the integrated device provides a sequential reading operation. In such a way it is possible to avoid repeating multiple times the single reading operation and accordingly the reading is very simplified.

The communication interface of the integrated device includes a sequence register for selecting one of a plurality of operation end codes and for determining the number of words to be read. This makes the operation of the integrated device very flexible.

A suggested choice for the operation end code is the last location of the memory sector associated with the initial reading address, the last memory location or the location associated with the address preceding the initial reading address.

Furthermore, a jump reading operation can be executed. Such an operation is very fast since it saves a number of clock periods depending on the number of bits of the address of a location (i.e., on the size of the memory).

Advantageously, the reading operation can be of the forward jump type or of the back jump type. Such a feature further increases the flexibility of the integrated device.

The integrated device also supports the single writing operation. Accordingly, the preferred embodiment of the present invention is perfectly compatible with the known devices.

A sequential writing operation, executed by the integrated device, allows writing a sequence of words. This operation is very effective, since it avoids repeating multiple times the single writing operation.

The parallel writing operation on the memory, in which it is possible to write in parallel a number of words compliant with the number of the programming elements of the memory, is particularly fast.

Alternatively, the integrated device can support multiple command codes only for reading or only for writing. In addition, reading and/or writing operations can be executed according to further modalities. For example, the operation end codes can be non-programmable and a sequence of a predefined number of words can be read.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated device including:
  a non-volatile memory including a matrix of memory cells that are grouped into a plurality of locations of the memory, each of the locations being selected by providing a corresponding address to the memory, the memory having an addressing parallelism and a data parallelism; and
  a communication interface for interfacing the memory with an external bus, the external bus having a transfer parallelism lower than the addressing parallelism and the data parallelism,
  wherein the communication interface includes an address register coupled to the memory, and control means for executing at least one of a plurality of reading operations and a plurality of writing operations on the memory according to different modalities, in response to command codes received from the external bus, and
  the control means includes means for storing an address that is received from the external bus in chunks corresponding to the transfer parallelism in the address register, at least part of the address stored in the address register being provided to the memory so as to select the corresponding location of the memory.

2. An integrated device including:
  a non-volatile memory having an addressing parallelism and a data parallelism; and
  a communication interface for interfacing the memory with an external bus, the external bus having a transfer parallelism lower than the addressing parallelism and the data parallelism,
  wherein the communication interface includes control means for executing at least one of a plurality of reading operations and a plurality of writing operations on the memory according to different modalities, in response to command codes received from the external bus,
  the command codes include a single reading command code,
  the communication interface further includes a data register for storing at least one word, and an address register,
  the memory includes a plurality of locations selectable by addresses, each of the locations storing a word, and
  the control means includes means responsive to the single reading command code for storing a reading address that is received from the external bus in chunks corresponding to the transfer parallelism in the address register, for reading a word selected by the reading address from the memory into the data register, and for transferring the word in the data register onto the external bus in chunks corresponding to the transfer parallelism.

3. The integrated device according to claim 2,
wherein the command codes include a sequential reading command code, and
the control means includes means responsive to the sequential reading command code for storing an initial reading address that is received from the external bus in chunks corresponding to the transfer parallelism in the address register, for reading a sequence of words selected by consecutive addresses starting from the initial reading address from the memory into the data register, and for transferring the sequence of words in the data register onto the external bus in chunks corresponding to the transfer parallelism.

4. The integrated device according to claim 3, wherein the communication interface further includes means for selecting one of a plurality of operation end codes, and means for determining a number of words in the sequence according to the selected operation end code.

5. The integrated device according to claim 4,
wherein the memory includes a plurality of sectors, and
the operation end codes include a sector end code for ending the reading of the sequence of words in response to the reading of a last word of the sector containing the initial reading address.

6. The integrated device according to claim 4, wherein the operation end codes include a memory end code for ending the reading of the sequence of words in response to the reading of a last word of the memory.

7. The integrated device according to claim 4, wherein the operation end codes include a cycle end code for ending the reading of the sequence of words in response to the reading of a word selected by an address preceding the initial reading address.

8. The integrated device according to claim 2,
wherein the command codes include at least one jump reading command code, and
the control means includes means responsive to the at least one jump reading command code for receiving an offset from the external bus, for updating the address stored in the address register according to the offset, for reading a word selected by the address in the address register from the memory into the data register, and for transferring the word in the data register onto the external bus in chunks corresponding to the transfer parallelism.

9. The integrated device according to claim 8,
wherein the at least one jump reading command code includes a forward jump reading command code and a back jump reading command code, and
the means for updating the address increases the address stored in the address register by the offset in response to the forward jump reading command code or decreases the address stored in the address register by the offset in response to the back jump reading command code.

10. The integrated device according to claim 2,
wherein the command codes include a single writing command code, and
the control means includes means responsive to the single writing command code for storing a writing address received from the external bus in chunks corresponding to the transfer parallelism in the address register, for storing a word received from the external bus in chunks corresponding to the transfer parallelism in the data register, and for writing the word in the data register into the location of the memory selected by the writing address.

11. The integrated device according to claim 2,
wherein the command codes include a sequential writing command code, and
the control means includes means responsive to the sequential writing command code for storing an initial writing address received from the external bus in chunks corresponding to the transfer parallelism in the address register, for storing a sequence of words received from the external bus in chunks corresponding to the transfer parallelism in the data register, and for writing the sequence of words in the data register into locations of the memory selected by consecutive addresses starting from the initial writing address.

12. The integrated device according to claim 2,
wherein the command codes include a parallel writing command code,
the memory includes a plurality of cells that each store a digit, and a plurality of programming elements that each are suitable for programming a cell,
the control means includes means responsive to the parallel writing command code for storing an initial writing address received from the external bus in chunks corresponding to the transfer parallelism in the address register, for storing a sequence of words received from the external bus in chunks corresponding to the transfer parallelism in the data register, for loading the sequence of words into the programming elements, and for writing the sequence of words loaded in the programming elements into memory locations selected by consecutive addresses starting from the initial writing address, and
the sequence of words has a length equal to the number of the programming elements.

13. A method of operating an integrated device that includes a non-volatile memory having an addressing parallelism and a data parallelism, and a communication interface for interfacing the memory with an external bus, the external bus having a transfer parallelism lower than the addressing parallelism and the data parallelism, the method comprising the steps of:
receiving command codes from the external bus; and
executing at least one of a plurality of reading operations and a plurality of writing operations on the memory according to different modalities, in response to the command codes received from the external bus,
wherein the memory includes a matrix of memory cells that are grouped into a plurality of locations of the memory, each of the locations being selected by providing a corresponding address to the memory, and
the executing step includes the sub-steps of:
storing an address that is received from the external bus in chunks corresponding to the transfer parallelism in an address register coupled to the memory; and
providing at least part of the address stored in the address register to the memory so as to select the corresponding location of the memory.

14. A method of operating an integrated device that includes a non-volatile memory having an addressing parallelism and a data parallelism, and a communication interface for interfacing the memory with an external bus, the external bus having a transfer parallelism lower than the addressing parallelism and the data parallelism, the method comprising the steps of:
receiving command codes from the external bus; and
executing at least one of a plurality of reading operations and a plurality of writing operations on the memory according to different modalities, in response to the command codes received from the external bus, wherein the command codes include a single reading command code, the memory includes a plurality of locations selectable by addresses that each store a word, and the executing step includes the sub-steps of:
- storing a reading address received from the external bus in chunks corresponding to the transfer parallelism in the address register;
- reading a word selected by the reading address from the memory into the data register; and
- transferring the word in the data register onto the external bus in chunks corresponding to the transfer parallelism.

15. The method according to claim 14, wherein the command codes include a sequential reading command code, and the executing step further includes the sub-steps of:
- storing an initial reading address received from the external bus in chunks corresponding to the transfer parallelism in the address register;
- reading a sequence of words selected by consecutive addresses starting from the initial reading address from the memory into the data register; and
- transferring the sequence of words in the data register onto the external bus in chunks corresponding to the transfer parallelism.

16. The method according to claim 15, wherein the executing step further includes the sub-steps of:
- selecting one of a plurality of operation end codes; and
- determining a number of words of the sequence according to the selected operation end code.

17. The method according to claim 16, wherein the memory includes a plurality of sectors, and the operation end codes include a sector end code for ending the reading of the sequence of words in response to the reading of a last word of the sector containing the initial reading address.

18. The method according to claim 16, wherein the operation end codes include a memory end code for ending the reading of the sequence of words in response to the reading of a last word of the memory.

19. The method according to claim 16, wherein the operation end codes include a cycle end code for ending the reading of the sequence of words in response to the reading of a word selected by an address preceding the initial reading address.

20. The method according to claim 14, wherein the command codes include at least one jump reading command code, and the executing step further includes the sub-steps of:
- receiving an offset from the external bus;
- updating the address stored in the address register according to the offset;
- reading a word selected by the address in the address register from the memory into the data register; and
- transferring the word in the data register onto the external bus in chunks corresponding to the transfer parallelism.

21. The method according to claim 20, wherein the at least one jump reading command code includes a forward jump reading command code and a back jump reading command code, and the sub-step of updating the address stored in the address register comprises increasing the address by the offset in response to the forward jump reading command code or decreasing the address by the offset in response to the back jump reading command code.

22. The method according to claim 14, wherein the command codes include a single writing command code, and the executing step further includes the sub-steps of:
- storing a writing address received from the external bus in chunks corresponding to the transfer parallelism in the address register;
- storing a word received from the external bus in chunks corresponding to the transfer parallelism in the data register; and
- writing the word in the data register into the location of the memory selected by the writing address.

23. The method according to claim 14, wherein the command codes include a sequential writing command code, and the executing step further includes the sub-steps of:
- storing an initial writing address received from the external bus in chunks corresponding to the transfer parallelism in the address register;
- storing a sequence of words received from the external bus in chunks corresponding to the transfer parallelism in the data register; and
- writing the sequence of words in the data register into locations of the memory selected by consecutive addresses starting from the initial writing address.

24. The method according to claim 14, wherein the command codes include a parallel writing command code, the memory includes a plurality of cells that each store a digit, and a plurality of programming elements that each are suitable for programming a cell, and the executing step further includes the sub-steps of:
- storing an initial writing address received from the external bus in chunks corresponding to the transfer parallelism in the address register;
- storing a sequence of words received from the external bus in chunks corresponding to the transfer parallelism in the data register;
- loading the sequence of words into the programming elements; and
- writing the sequence of words loaded in the programming elements into memory locations selected by consecutive addresses starting from the initial writing address, wherein the sequence of words has a length equal to the number of the programming elements.

* * * * *